(12) United States Patent
Takahashi et al.

(10) Patent No.: US 8,705,270 B2
(45) Date of Patent: Apr. 22, 2014

(54) SEMICONDUCTOR MEMORY

(75) Inventors: Masahiro Takahashi, Yokohama (JP);
Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 13/415,662

(22) Filed: Mar. 8, 2012

(65) Prior Publication Data

US 2012/0230090 A1 Sep. 13, 2012

(30) Foreign Application Priority Data

Mar. 11, 2011 (JP) .................................. 2011-54029

(51) Int. Cl.
*G11C 11/00* (2006.01)
*G11C 11/16* (2006.01)
(52) U.S. Cl.
CPC ...................................... *G11C 11/16* (2013.01)
USPC ........ 365/158; 365/148; 365/189.16; 365/63; 365/189.15
(58) Field of Classification Search
CPC ...... G11C 11/16; G11C 11/15; G11C 11/161; G11C 11/1653; G11C 2029/1204; G11C 7/20; G11C 8/08; G11C 8/10
USPC .................. 365/158, 148, 189.16, 63, 189.15
See application file for complete search history.

(56) References Cited

U.S. PATENT DOCUMENTS

| | | | |
|---|---|---|---|
| 6,903,965 B2 | 6/2005 | Ishikawa | |
| 7,376,003 B2 | 5/2008 | Iwata et al. | |
| 2009/0310400 A1* | 12/2009 | Takemura et al. | 365/158 |

FOREIGN PATENT DOCUMENTS

JP 2004103202 4/2004

OTHER PUBLICATIONS

M. Hosomi, et al. "A Novel Nonvolatile Memory with Spin Torque Transfer Magnetization Switching: Spin-RAM", Electron Devices Meetings 2005, IEDM Technical Digest IEEE International, 5-5 Dec. 2005, on p. 459.
U.S. Appl. No. 13/191,678, filed Jul. 27, 2011, Takahashi.

* cited by examiner

*Primary Examiner* — Thong Q Le
(74) *Attorney, Agent, or Firm* — Knobbe, Martens, Olson & Bear, LLP

(57) ABSTRACT

A semiconductor memory has a first switch circuit and a second switch circuit. The semiconductor memory has a row decoder that controls a voltage of a word line. The semiconductor memory has a first writing circuit including a first signal terminal connected to one end of the first switch circuit to input and output a writing current. The semiconductor memory has a second writing circuit including a second signal terminal connected to a one end of the second switch circuit to input and output the writing current. The semiconductor memory has a select transistor including a control terminal connected to the word line. The semiconductor memory has a resistance change element that is connected in series with the select transistor between the first bit line and the second bit line and varies in resistance value depending on an applied current.

20 Claims, 2 Drawing Sheets

SEMICONDUCTOR MEMORY

CROSS-REFERENCE TO RELATED APPLICATION

This application is based upon and claims the benefit of priority from the prior Japanese Patent Application No. 2011-54029, filed on Mar. 11, 2011, the entire contents of which are incorporated herein by reference.

BACKGROUND

1. Field

Embodiments described herein relate generally to a semiconductor memory.

2. Background Art

In recent years, semiconductor memories including resistance change elements serving as memory cells have gained attention as next-generation memories. Such semiconductor memories include a magnetoresistive random access memory (MRAM) having magnetoresistive elements serving as memory cells, a phase change random access memory (PRAM), and a resistive random access memory (ReRAM).

For example, in an MRAM, a memory element is a magnetoresistive element called a magnetic tunnel junction (MTJ) element.

The MTJ element includes a fixed layer (pin layer) in which a direction of magnetization is fixed by an antiferromagnetic layer, a free layer (recording layer) in which a direction of magnetization can be freely inverted, and an insulating layer (barrier layer) interposed between the fixed layer and the free layer. In the MTJ element, a resistance change called a magnetoresistance effect is utilized. The resistance change is caused by a direction of magnetization of the free layer relative to the fixed layer.

In other words, data is identified as "1" or "0" using a resistance difference caused by a relative direction of magnetization.

Particularly, spin injection MRAMs have recently received attention, in which flux reversal made by polarized spin current injection is used for a writing scheme. In a spin injection MRAM, a current amount required for flux reversal (inversion threshold current) is specified by the density of current passing through an MTJ element.

Furthermore, a writing operation is performed on the spin injection MRAM by applying a writing current not lower than the inversion threshold current.

Moreover, the polarity ("0" or "1") of data is determined by the injection direction of the writing current to the MTJ element.

For example, in the case where a certain piece of information is written in the MTJ element, an excessive current flows in one writing direction relative to an inversion current and a writing current in the other direction fails to meet the inversion current due to an easy direction of flux reversal of the MTJ element and the positional relationship between a cell transistor and the MTJ element.

In other words, characteristics vary depending on the writing direction.

Thus, unfortunately, an excessive load may be applied to the MTJ element by an excessive current in one writing direction and an insufficient writing current in the other direction may reduce a writing margin.

DETAILED DESCRIPTION

An output circuit which outputs an output signal based on an input signal from an output terminal and brings the output terminal into a high impedance state in response to an impedance control signal, the output circuit according to an embodiment.

A semiconductor memory according to an embodiment has a first switch circuit having a first end connected to a first end of a first bit line. The semiconductor memory has a second switch circuit having a first end connected to a first end of a second bit line. The semiconductor memory has a row decoder that controls a voltage of a word line. The semiconductor memory has a first writing circuit including a first signal terminal connected to a second end of the first switch circuit to input and output a writing current. The semiconductor memory has a second writing circuit including a second signal terminal connected to a second end of the second switch circuit to input and output the writing current. The semiconductor memory has a select transistor including a control terminal connected to the word line. The semiconductor memory has a resistance change element that is connected in series with the select transistor between the first bit line and the second bit line and varies in resistance value depending on an applied current.

The first switch circuit includes a first pMOS transistor connected between the first end of the first bit line and the first signal terminal and a first nMOS transistor connected in parallel with the first pMOS transistor between the first end of the first bit line and the first signal terminal, the first pMOS transistor and the first nMOS transistor being controlled so as to be simultaneously turned on/off.

The second switch circuit includes a second pMOS transistor connected between the first end of the second bit line and the second signal terminal and a second nMOS transistor connected in parallel with the second pMOS transistor between the first end of the second bit line and the second signal terminal, the second pMOS transistor and the second nMOS transistor being controlled so as to be simultaneously turned on/off.

The first pMOS transistor is larger in size than the first nMOS transistor.

Hereafter, a semiconductor memory according to the present invention will be described more specifically with reference to the drawings.

Embodiment will be described below with reference to the accompanying drawings.

First Embodiment

Figure 1:
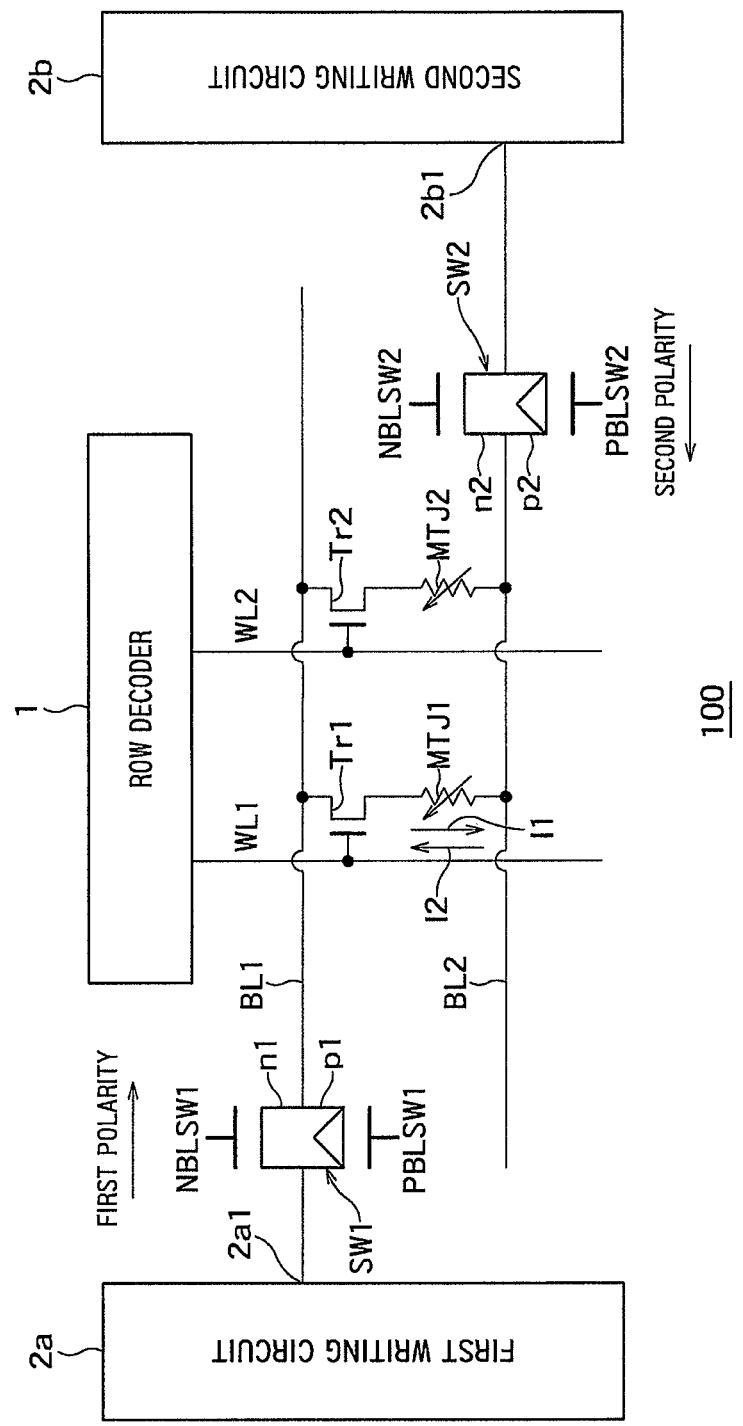
FIG. 1 is a diagram showing an example of the configuration of a semiconductor memory 100 according to a first embodiment.

FIG. 1 illustrates an example of the configuration of a semiconductor memory 100 according to a first embodiment.

As illustrated in FIG. 1, the semiconductor memory (spin injection MRAM) 100 includes a row decoder 1, a first writing circuit 2a, a second writing circuit 2b, a select transistor Tr1, a select transistor Tr2, a first bit line BL1, a second bit line BL2, word lines WL1 and WL2, a first switch circuit SW1, a second switch circuit SW2, a resistance change element MTJ1, and a resistance change element MTJ2.

The switch circuit SW1 has one end connected to one end of the first bit line BL1 and the other end connected to a first signal terminal 2a1. The first switch circuit SW1 is, for example, a transmission gate that is turned on/off by control signals NBLSW1 and PBLSW1.

Specifically, the first switch circuit SW1 includes a first pMOS transistor p1 that is connected between one end of the first bit line BL1 and the first signal terminal 2a1 and a first nMOS transistor n1 that is connected in parallel with the first pMOS transistor p1 between one end of the first bit line BL1 and the first signal terminal 2a1. The first pMOS transistor p1 and the first nMOS transistor n1 are controlled so as to be simultaneously turned on/off by the control signals NBLSW1 and PBLSW1.

The switch circuit SW2 has one end connected to one end of the second bit line BL2 and the other end connected to a second signal terminal 2a2. The second switch circuit SW2 is, for example, a transmission gate that is turned on/off by control signals NBLSW2 and PBLSW2.

Specifically, the second switch circuit SW2 includes a second pMOS transistor p2 that is connected between one end of the second bit line BL2 and a second signal terminal 2b1 and a second nMOS transistor n2 that is connected in parallel with the second pMOS transistor p2 between one end of the second bit line BL2 and the second signal terminal 2b1. The second pMOS transistor and the second nMOS transistor n2 are controlled so as to be simultaneously turned on/off by the control signals NBLSW2 and PBLSW2.

The size of the first pMOS transistor p1 is set larger than that of the first nMOS transistor n1. For example, the gate width of the first pMOS transistor p1 is larger than that of the first nMOS transistor n1.

The size of the first nMOS transistor n1 is set smaller than that of the second nMOS transistor n2.

The size of the first pMOS transistor p1 is set larger than that of the second pMOS transistor p2.

The size of the second pMOS transistor p2 is set smaller than that of the second nMOS transistor n2. For example, the gate width of the second nMOS transistor n2 is larger than that of the second pMOS transistor.

The control signals NBLSW1, NBLSW2, PBLSW1, and PBLSW2 are generated by decoding an address signal, which is inputted from the outside, through a decoder (not shown). In other words, the first and second switch circuits SW1 and SW2 are controlled in response to the address signal inputted from the outside.

The row decoder 1 controls the voltages of the word lines WL1 and WL2.

The first writing circuit 2a is connected to the first signal terminal 2a1 for inputting and outputting a writing current to the other end of the first switch circuit SW1. The first writing circuit 2a applies a predetermined voltage (current) to the first signal terminal 2a1 during a writing operation.

The second writing circuit 2b is connected to the second signal terminal 2b1 for inputting and outputting the writing current to the other end of the second switch circuit SW2. The second writing circuit 2b applies the predetermined voltage (current) to the second signal terminal 2b1 during the writing operation.

The select transistor Tr1 is a MOS transistor whose control terminal (gate) is connected to the word line WL1.

The resistance change element MTJ1 is connected in series with the select transistor Tr1 between the first bit line BL1 and the second bit line BL2. The resistance change element MTJ1 varies in resistance value depending on an applied current.

In the present embodiment, one end (source) of the select transistor Tr1 is connected to the first bit line BL1. The resistance change element MTJ1 is connected between the other end (drain) of the select transistor Tr1 and the second bit line BL.

The select transistor Tr1 and the resistance change element MTJ1 constitute a cell unit.

The select transistor Tr2 is a MOS transistor whose control terminal (gate) is connected to the word line WL1.

The resistance change element MTJ2 is connected in series with the select transistor Tr2 between the first bit line BL1 and the second bit line BL2. The resistance change element MTJ2 varies in resistance value depending on an applied current.

In the present embodiment, one end (source) of the select transistor Tr2 is connected to the second bit line BL2. The resistance change element MTJ2 is connected between the other end (drain) of the select transistor Tr2 and a third bit line BL3.

The select transistor Tr2 and the resistance change element MTJ2 constitute a cell unit.

In this case, the resistance change elements MTJ1 and MTJ2 are, for example, magnetoresistive elements (particularly, MTJ elements).

For example, in the case of a first polarity current not lower than a first inversion threshold current, the resistance change elements MTJ1 and MTJ2 each have a first resistance value. In the case where a current not lower than a second inversion threshold current flows to second polarity that is different from first polarity, the resistance change elements MTJ1 and MTJ2 each have a second resistance value.

As illustrated in FIG. 1, the first polarity is a direction along which a positive current flows to the second bit line BL1 from the first bit line BL1 through the resistance change elements MTJ1 and MTJ2. The second polarity is a direction along which a positive current flows to the first bit line BL1 from the second bit line BL2 through the resistance change elements MTJ1 and MTJ2.

Figure 2:
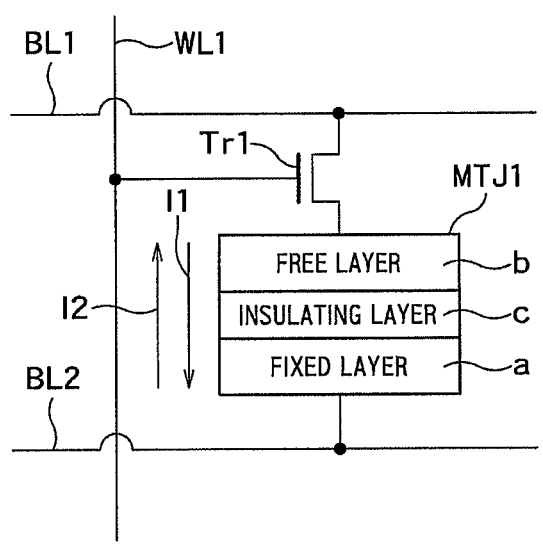
FIG. 2 is a diagram showing a specific example of the configuration of the cell unit including the select transistor Tr1 and the resistance change element MTJ1 of FIG. 1.

FIG. 2 illustrates a specific example of the configuration of the cell unit including the select transistor Tr1 and the resistance change element MTJ1 of FIG. 1.

As illustrated in FIG. 2, the resistance change element MTJ1, which is an MTJ element, includes a fixed layer a in which a direction of magnetization is fixed by an antiferromagnetic layer, a free layer b in which a direction of magnetization can be freely inverted, and an insulating film c interposed between the fixed layer a and the free layer b.

The free layer b is connected to the first bit line BL1 (connected to the first bit line BL1 via the select transistor Tr1).

The fixed layer a is connected to the second bit line BL2.

A specific example of the cell unit including the select transistor Tr2 and the resistance change element MTJ2 is identical to FIG. 2.

In the resistance change element MTJ1 connected as illustrated in FIG. 2, a first writing current flowing in a first polarity direction tends to have a large resistance value during a first writing operation, whereas a second writing current flowing in a second polarity direction tends to have a small resistance value during a second writing operation.

In other words, a first writing current I1 in the first polarity direction tends to insufficiently flow and a second writing current I2 in the second polarity direction tends to excessively flow.

Thus, as described above, the size of the first pMOS transistor p1 is set larger than that of the first nMOS transistor n1. Furthermore, the size of the first pMOS transistor p1 is set larger than that of the second pMOS transistor.

Hence, the on resistance of the first pMOS transistor p1 can be reduced and the first writing current I1 can be increased in the first writing operation.

Moreover, the size of the first nMOS transistor n1 is set smaller than that of the second nMOS transistor n2. The first nMOS transistor n1 may be omitted.

With this configuration, an increase in circuit area that corresponds to a size increase of the first pMOS transistor p1 can be offset. Furthermore, the excessive second writing current I2 of the second polarity can be suppressed.

As described above, the size of the second pMOS transistor is set smaller than that of the second nMOS transistor n2. The second pMOS transistor p2 may be omitted.

Hence, the on resistance of the second nMOS transistor n2 can be reduced and the first writing current I1 can be increased in the first writing operation. An increase in circuit area that corresponds to a size increase of the second nMOS transistor n2 can be offset. Furthermore, the excessive second writing current I2 of the second polarity can be suppressed.

In other words, the size ratio of the first nMOS transistor n1 to the first pMOS transistor p1 is set such that the writing current of the first polarity in the resistance change element MTJ1 is equal to or higher than the first inversion threshold current when the select transistor Tr1, the first and second pMOS transistors p1 and p2, and the first and second nMOS transistors n1 and n2 are turned on in the first writing operation.

Similarly, the size ratio of the second nMOS transistor n2 to the second pMOS transistor p2 is set such that the writing current I2 of the second polarity in the resistance change element MTJ1 is equal to or higher than the second inversion threshold current when the select transistor Tr2, the first and second pMOS transistors p1 and p2, and the first and second nMOS transistors n1 and n2 are turned on in the second writing operation.

In this way, it is possible to compensate for the writing current in the first polarity direction, suppress the excessive writing current in the second polarity direction, increase a writing margin, and reduce a burden to the resistance change element.

The same effect can be obtained by setting the threshold voltage of the first pMOS transistor p1 lower than that of the second pMOS transistor p2.

The following will describe some examples of the writing operation of the semiconductor memory 100 configured thus.

The following example will discuss a writing operation on the resistance change element MTJ1 of the semiconductor memory 100. In other words, the resistance change element MTJ1 is selected while the resistance change element MTJ2 is not selected.

In the initial state of the first writing operation, the control signals NBLSW1 and NBLSW2 are kept at "Low" level (e.g., a ground potential) and the control signals PBLSW1 and PBLSW2 are kept at "High" level (e.g., a power supply potential) in response to the address signal. Thus, the first and second switch circuits SW1 and SW2 are turned off.

Moreover, the row decoder 1 controls a voltage applied to the word lines WL1 and WL2 ("Low" level), so that the select transistors Tr1 and Tr2 are turned off.

Then, the first and second select transistors Tr1 and Tr2 are continuously turned off. In this state, the control signals NBLSW1 and NBLSW2 are changed to "High" level (e.g., the power supply potential) and the control signals PBLSW1 and PBLSW2 are changed to "Low" level (the ground potential) in response to the address signal.

Thus, the first and second switch circuits SW1 and SW2 are turned on to electrically connect the first signal terminal 2a1 and one end of the first bit line BL1 and electrically connect the second signal terminal 2b1 and the other end of the second bit line BL2.

Moreover, the first writing circuit 2a applies a first voltage (power supply voltage) to the first signal terminal 2a1. The second writing circuit 2b applies a second voltage (ground voltage), which is different from the first voltage, to the second signal terminal 2b1.

Hence, the first and second bit lines BL1 and BL2 are ideally set at the first voltage and the second voltage, respectively.

As described above, the size ratio of the first nMOS transistor n1 to the first pMOS transistor p1 and the size ratio of the second nMOS transistor n2 to the second pMOS transistor p2 are set such that the writing current I1 of the first polarity in the resistance change element MTJ1 is equal to or higher than the first inversion threshold current.

Hence, for example, a potential difference between the first voltage and the second voltage allows the first writing current I1 of the first polarity to pass through the resistance change element MTJ1 serving as a selected cell, the first writing current I1 being equal to or higher than the first inversion threshold current. In other words, the resistance value of the resistance change element MTJ1 is the first resistance value.

During the first writing operation, the row decoder 1 keeps the potential of the word line WL2 at "Low" level. Thus, the select transistor Tr2 is kept turned off and the resistance change element TMJ2, which serves as an unselected cell, is not fed with a current. In other words, the writing operation is not performed on the resistance change element TMJ2 serving as an unselected cell.

The second writing operation of the second polarity is similarly performed.

A writing operation performed on the resistance change element MTJ2 of the semiconductor memory 100 is similar to that on the resistance change element MTJ1.

As described above, the semiconductor memory according to the first embodiment makes it possible to increase a writing margin and reduce a circuit area.

In the example of the semiconductor memory 100 in FIG. 1, the two cell units constitute a memory cell array. The present invention is similarly applicable to a semiconductor memory including a memory cell array made up of three or more cell units. Also in this case, the same effect can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a first switch circuit having a first end connected to a first end of a first bit line;
   a second switch circuit having a first end connected to a first end of a second bit line;
   a row decoder that controls a voltage of a word line;
   a first writing circuit including a first signal terminal connected to a second end of the first switch circuit to input and output a writing current,
   a second writing circuit including a second signal terminal connected to a second end of the second switch circuit to input and output the writing current, a select transistor including a control terminal connected to the word line; and a resistance change element that is connected in series with the select transistor between the first bit line and the second bit line, wherein the first switch circuit includes a first pMOS transistor connected between the first end of the first bit line and the first signal terminal and a first nMOS transistor connected in parallel with the first pMOS transistor between the first end of the first bit line and the first signal terminal, the second switch circuit includes a second pMOS transistor connected between the first end of the second bit line and the second signal terminal and a second nMOS transistor connected in parallel with the second pMOS transistor between the first end of the second bit line and the second signal terminal, and the first pMOS transistor is larger in size than the first nMOS transistor.

2. The semiconductor memory according to claim 1, wherein a size of the first nMOS transistor is smaller than a size of the second nMOS transistor, wherein a size of the first pMOS transistor is larger than a size of the first nMOS transistor, and wherein the size of the second pMOS transistor is smaller than the size of the first pMOS transistor.

3. The semiconductor memory according to claim 1, wherein the resistance change element has a first resistance value when fed with a current of first polarity, the current being equal to or higher than a first inversion threshold current, and the resistance change element has a second resistance value when fed with a current of second polarity different from the first polarity, the current being equal to or higher than a second inversion threshold current.

4. The semiconductor memory according to claim 3, wherein a size ratio of the first nMOS transistor to the first pMOS transistor is set such that the writing current of the first polarity in the resistance change element is, equal to or higher than the first inversion threshold current when the select transistor, the first and second pMOS transistors, and the first and second nMOS transistors are turned on in a first writing operation.

5. The semiconductor memory according to claim 3, wherein a size ratio of the second nMOS transistor to the second pMOS transistor is set such that the writing current of the second polarity in the resistance change element is equal to or higher than the second inversion threshold current when the select transistor, the first and second pMOS transistors, and the first and second nMOS transistors are turned on in a second writing operation.

6. The semiconductor memory according to claim 4, wherein a size ratio of the second nMOS transistor to the second pMOS transistor is set such that the writing current of the second polarity in the resistance change element is equal to or higher than the second inversion threshold current when the select transistor, the first and second pMOS transistors, and the first and second nMOS transistors are turned on in a second writing operation.

7. The semiconductor memory according to claim 3, wherein the first polarity is a direction along which a positive current flows from the first bit line to the second bit line through the resistance change element, and the second polarity is a direction along which the positive current flows from the second bit line to the first bit line through the resistance change element.

8. The semiconductor memory according to claim 4, wherein the first polarity is a direction along which a positive current flows from the first bit line to the second bit line through the resistance change element, and the second polarity is a direction along which the positive current flows from the second bit line to the first bit line through the resistance change element.

9. The semiconductor memory according to claim 5, wherein the first polarity is a direction along which a positive current flows from the first bit line to the second bit line through the resistance change element, and the second polarity is a direction along which the positive current flows from the second bit line to the first bit line through the resistance change element.

10. The semiconductor memory according to claim 1, wherein the resistance change element is a magnetoresistive element.

11. The semiconductor memory according to claim 1, wherein a gate width of the first pMOS transistor is larger than a gate width of the first nMOS transistor.

12. The semiconductor memory according to claim 1, wherein a gate width of the second nMOS transistor is larger than a gate width of the second pMOS transistor.

13. The semiconductor memory according to claim 1, wherein the resistance change element is a magnetic tunnel junction (MTJ) element, the MTJ element includes a fixed layer in which a direction of magnetization is fixed by an antiferromagnetic layer, a free layer in which a direction of magnetization can be freely inverted, and an insulating film interposed between the fixed layer and the free layer, the free layer is connected to the first bit line, the fixed layer is connected to the second bit line, and the semiconductor memory is a spin injection MRAM.

14. The semiconductor memory according to claim 1, wherein the first pMOS transistor and the first nMOS transistor being controlled so as to be simultaneously turned on/off, and the second pMOS transistor and the second nMOS transistor being controlled so as to be simultaneously turned on/off.

15. The semiconductor memory according to claim 1, wherein a threshold voltage of the first pMOS transistor is lower than a threshold voltage of the second pMOS transistor.

16. The semiconductor memory according to claim 15, wherein the first pMOS transistor and the first nMOS transistor being controlled so as to be simultaneously turned on/off, and the second pMOS transistor and the second nMOS transistor being controlled so as to be simultaneously turned on/off.

17. A semiconductor memory comprising:

a first switch circuit having a first end connected to a first end of a first bit line;

a second switch circuit having a first end connected to a first end of a second bit line;

a row decoder that controls a voltage of a word line;

a first writing circuit including a first signal terminal connected to a second end of the first switch circuit to input and output a writing current, a second writing circuit including a second signal terminal connected to a second end of the second switch circuit to input and output the writing current, a select transistor including a control terminal connected to the word line; and a resistance change element that is connected in series with the select transistor between the first bit line and the second bit line, wherein the first switch circuit includes a first pMOS transistor connected between the first end of the first bit line and the first signal terminal and a first nMOS transistor connected in parallel with the first pMOS transistor between the first end of the first bit line and the first signal terminal, the second switch circuit includes a second pMOS transistor connected between the first end of the second bit line and the second signal terminal and a second nMOS transistor connected in parallel with the second pMOS transistor between the first end of the second bit line and the second signal terminal, and a threshold voltage of the first pMOS transistor is lower than a threshold voltage of the second pMOS transistor.

18. The semiconductor memory according to claim 17, wherein the resistance change element has a first resistance value when fed with a current of first polarity, the current being equal to or higher than a first inversion threshold current, and the resistance change element has a second resistance value when fed with a current of second polarity different from the first polarity, the current being equal to or higher than a second inversion threshold current.

19. The semiconductor memory according to claim 17, wherein the resistance change element is a magnetic tunnel junction (MTJ) element, the MTJ element includes a fixed layer in which a direction of magnetization is fixed by an antiferromagnetic layer, a free layer in which a direction of magnetization can be freely inverted, and an insulating film interposed between the fixed layer and the free layer, the free layer is connected to the first bit line, the fixed layer is connected to the second bit line, and the semiconductor memory is a spin injection MRAM.

20. The semiconductor memory according to claim 17, wherein the first pMOS transistor and the first nMOS transistor being controlled so as to be simultaneously turned on/off, and the second pMOS transistor and the second nMOS transistor being controlled so as to be simultaneously turned on/off.

* * * * *